(12) United States Patent
Hsiao et al.

(10) Patent No.: US 9,318,371 B2
(45) Date of Patent: Apr. 19, 2016

(54) SHALLOW TRENCH ISOLATION STRUCTURE

(71) Applicant: Taiwan Semiconductor Manufacturing CO., LTD., Hsinchu (TW)

(72) Inventors: Ru-Shang Hsiao, Jhubei (TW); Ling-Sung Wang, Tainan (TW); Chih-Mu Huang, Tainan (TW); Chih-Fu Chang, Neipu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 19 days.

(21) Appl. No.: 14/189,155

(22) Filed: Feb. 25, 2014

(65) Prior Publication Data
US 2015/0243653 A1 Aug. 27, 2015

(51) Int. Cl.
*H01L 23/34* (2006.01)
*H01L 21/76* (2006.01)
*H01L 21/762* (2006.01)
*H01L 27/088* (2006.01)
*H01L 21/8234* (2006.01)

(52) U.S. Cl.
CPC .... *H01L 21/76232* (2013.01); *H01L 21/76224* (2013.01); *H01L 21/76297* (2013.01); *H01L 21/823481* (2013.01); *H01L 27/088* (2013.01)

(58) Field of Classification Search
CPC ............ H01L 21/76232; H01L 27/088; H01L 21/76297
USPC ........... 257/725, 395–397; 438/427, 359, 362
See application file for complete search history.

(56) References Cited

U.S. PATENT DOCUMENTS 6,100,199 A * 8/2000 Joshi et al. .................... 438/694
9,087,741 B2 * 7/2015 Cheng et al.

FOREIGN PATENT DOCUMENTS

JP 403240255 * 2/1990 .................... 438/404

* cited by examiner

*Primary Examiner* — Calvin Lee

(57) ABSTRACT

A semiconductor device includes a semiconductor substrate, an active region and a trench isolation. The active region is formed in the semiconductor substrate. The trench isolation is disposed adjacent to the active region. The trench isolation includes a lower portion and an upper portion. The upper portion is located on the lower portion. The upper portion has a width gradually decreased from a junction between the upper portion and the lower portion toward a top of the trench isolation. In a method for fabricating the semiconductor device, at first, the semiconductor substrate is etched to form a trench in the semiconductor substrate. Then, an insulator fills the trench to form the trench isolation. Thereafter, the gate structure is formed on the semiconductor substrate. Then, the semiconductor substrate is etched to form a recess adjacent to the trench isolation. Thereafter, at least one doped epitaxial layer grows in the recess.

20 Claims, 9 Drawing Sheets

SHALLOW TRENCH ISOLATION STRUCTURE

BACKGROUND

In general, various semiconductor devices such as resistors, transistors, and diodes are formed on or within a semiconductor substrate. These semiconductor devices are formed by patterned conductor layers and dielectric layers. Trench isolations are used to separate and isolate active regions of the semiconductor devices from each other on the semiconductor substrate. However, when a trench isolation is formed adjacent to a source region or a drain region of the active region, a facet surface is often caused in the source region or drain region, and the facet surface raises processing issues subsequently, for example, when a contact is landed on the source region or drain region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
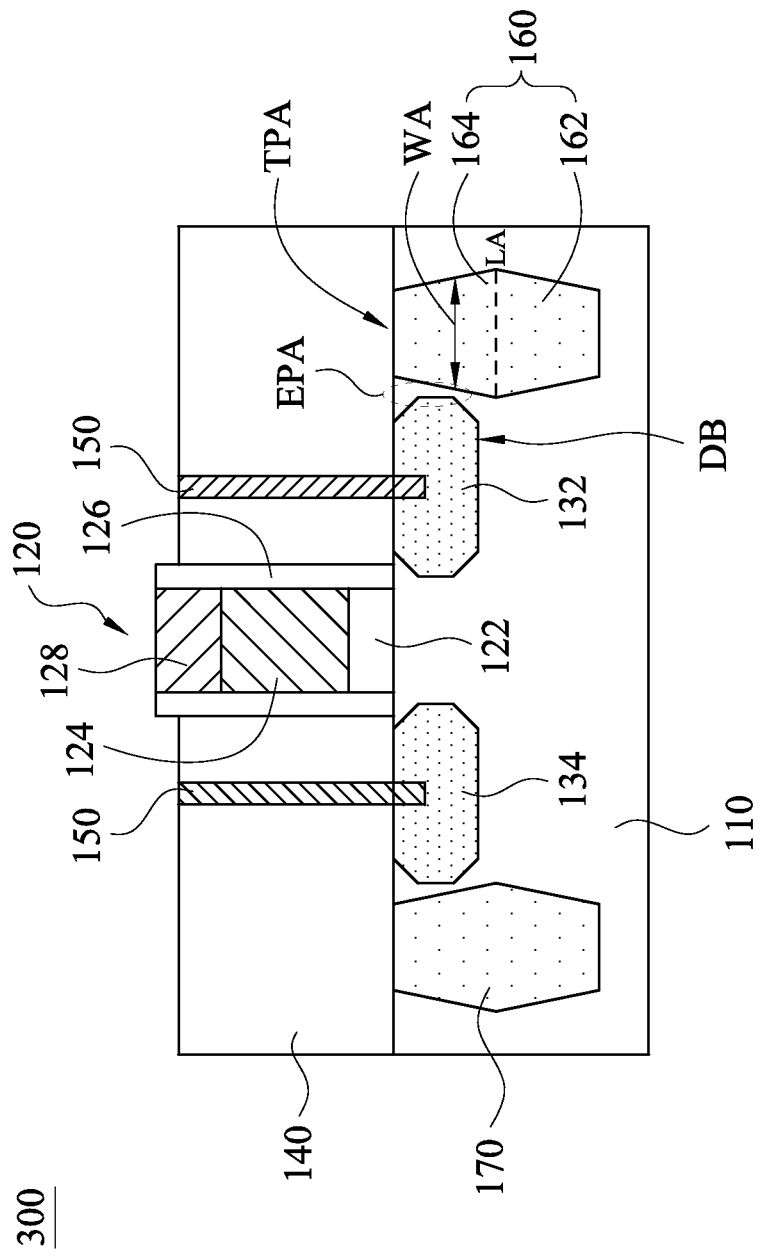
FIG. 1 is a schematic cross-sectional view of a semiconductor device according to various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Embodiments of the present disclosure are directed to structures of trench isolations. In various embodiments, a trench isolation includes a lower portion and an upper portion located on the lower portion. The upper portion is located on the lower portion and has a width gradually decreased from a junction between the upper portion and the lower portion toward a top of the trench isolation, such that a substrate portion is left for providing a suitable surface to help growth of a source/drain region adjacent to the trench isolation.

FIG. 1 is a schematic cross-sectional view of a semiconductor device 100 according to various embodiments. The semiconductor device 100 includes a semiconductor substrate 110, a gate structure 120, an active region (not labeled), a dielectric layer 140, contact structures 150, and trench isolations 160 and 170. The gate structure 120 is disposed on the semiconductor substrate 110. The active region and the trench isolations 160 are disposed in the semiconductor substrate 110. In some embodiments, the active region is represented by a drain region 132 and a source region 134. The gate structure 120, the drain region 132, and the source region 134 are used to form a transistor, and the contact structures 150 are disposed on the drain region 132 and the source region 134 to electrically connect the transistor with other elements.

The semiconductor substrate 110 is defined as any construction including semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The material forming the first conductor 110 and the second conductor 120 includes, but is not limited to aluminum (Al), copper (Cu), silver (Ag), gold (Au), nickel (Ni), tungsten (W), or an alloy thereof. The material of the insulator 132 includes, but is not limited to aluminum oxide ($Al_2O_3$), hafnium oxide ($HfO_2$), silicon carbide (SiC), silicon nitride, tantalum oxide ($Ta_2O_5$), tantalum oxynitride, titanium oxide, lead zirconate titanate (PZT), strontium bismuth tantalite (SBT), bismuth strontium tantalite (BST), strontium tantalite (ST), magnesium oxide, calcium oxide, hafnium silicon oxide, hafnium silicon oxynitride, zirconium oxide, yttrium oxide, strontium oxide, lanthanum oxide, barium oxide, or combinations thereof.

The gate structure 120 includes gate dielectric 122, gate electrode 124, spacers 126, and a silicide contact 128. The gate dielectric 122 and the gate electrode 124 are disposed and patterned on the substrate 110. The material forming the gate dielectric 122 is a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The material forming the gate electrode 124 is a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In some embodiments, amorphous silicon is deposited and recrystallized to create poly-crystalline silicon (poly-silicon).

Spacers 126 are disposed along the sidewalls of the gate dielectric 122 and the gate electrode 124. The material forming the spacers 126 includes SiN, oxynitride, SiC, SiON, oxide, or the like. The silicide contact 128 is optionally disposed on the gate electrode 124. The material forming the silicide contact 128 includes nickel, titanium, cobalt, palladium, platinum, erbium or the like.

The drain region 132 and the source region 134 are disposed in the semiconductor substrate 110, and the gate structure 120 is interposed between the drain region 132 and the source region 134. An epitaxial (epi) process may be used to form the drain region 132 and the source region 134. The epitaxial process may use gaseous and/or liquid precursors to interact with the composition of the substrate 110, thereby depositing semiconductor material for forming the drain region 132 and the source region 134. The deposited semiconductor material provides stress or strain to a channel region of the transistor to enhance carrier mobility of the transistor and enhance transistor performance. In some embodiments, silicon germanium (SiGe) is deposited by an epi process to form SiGe source and SiGe drain regions. In some embodiments, the drain region 132 and the source region 134 may be doped with a suitable dopant, such as boron (B). In some embodiments, the drain region 132 and the source region 134 are silicon (Si) source and drain regions, which may be doped with a suitable dopant, such as carbon (C). The drain region 132 and the source region 134 may be in-situ doped or undoped during the epi process, and then doped in a subsequent process.

The doping may be achieved by an ion implantation process, a plasma immersion ion implantation (PIII) process, a gas and/or solid source diffusion process, other suitable process, or combinations thereof. The drain region 132 and the source region 134 may further be exposed to annealing processes, such as a rapid thermal annealing process.

The dielectric layer 140, such as an interlayer (or interlevel) dielectric (ILD) layer, is disposed on the substrate 110. The dielectric layer 140 includes a dielectric material, such as silicon oxide, silicon nitride, silicon oxynitride, low-k dielectric material, other suitable dielectric materials, or combinations thereof. In some embodiments, the low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In some embodiments the dielectric layer 140 may include a multilayer structure having multiple dielectric materials.

The contact structures 150 are electrically connected to the drain region 132 and the source region 134. The contact structures 150 include a conductive material, such as aluminum, copper, titanium, titanium nitride, tantalum, tantalum nitride, tungsten, polysilicon, metal silicide, alloys thereof, or combinations thereof. The contact structures 150 may be formed by etching openings those extend through the dielectric layer 140 and expose the drain region 132 and the source region 134, and filling the etched openings with the conductive material.

The trench isolations 160 and 170 are disposed in the substrate 110 to define the active region, in which the transistor is formed. In some embodiments, one or both of the trench isolations 160 and 170 are formed with diamond-like cross sections. For convenience of explanation, the trench isolation 160 is used as an example for explaining the diamond-like cross section. The trench isolation 160 includes a lower portion 162 and an upper portion 164. The upper portion 164 is located on the lower portion 162 and has a width WA gradually decreased from a junction LA between the upper portion 164 and the lower portion 162 toward a top TPA of the trench isolation 160. In some embodiments, a width of the junction LA is widest in the upper portion 164, and the junction LA is lower than or aligned to a bottom DB of the adjacent active region.

The trench isolation 160 is formed by using shallow trench isolation (STI) technology. The trench isolation 160 includes silicon oxide, silicon nitride, silicon oxynitride, other suitable materials, or combinations thereof. The reasons for forming the trench isolations 160 with diamond-like cross sections are explained as follows.

For forming the source region 132, a source recess are first formed on the substrate 110, and then a epitaxial process is performed to deposit a semiconductor material in the source/drain recesses, in which the semiconductor material can not be deposited on the surfaces of the trench isolations. In the trench isolation 160 with the diamond-like cross section, the upper portion 164 of the trench isolation 160 gradually shrinks from the junction LA to the top TPA of the trench isolation, and thus a substrate portion EPA may remains in the semiconductor substrate 110 during the formation of the source recesses. The slant upper portion 164 allows the substrate portion EPA is left. Therefore, when the epitaxial process is performed to form the source region 132, the substrate portion EPA provides a suitable surface to help the growth of the source/drain region. For example, when the epitaxial process is performed to form the drain region 132, the semiconductor material forming the drain region 132 is likely to be deposited on the surface of the substrate portion EPA. The trench isolation 160 does not interfere the growth of the semiconductor material on the drain region 132. Therefore the drain region 132 is prevented from forming a facet, which may result in junction leakage, and design rules for the active region can be more flexible.

Figure 2A:
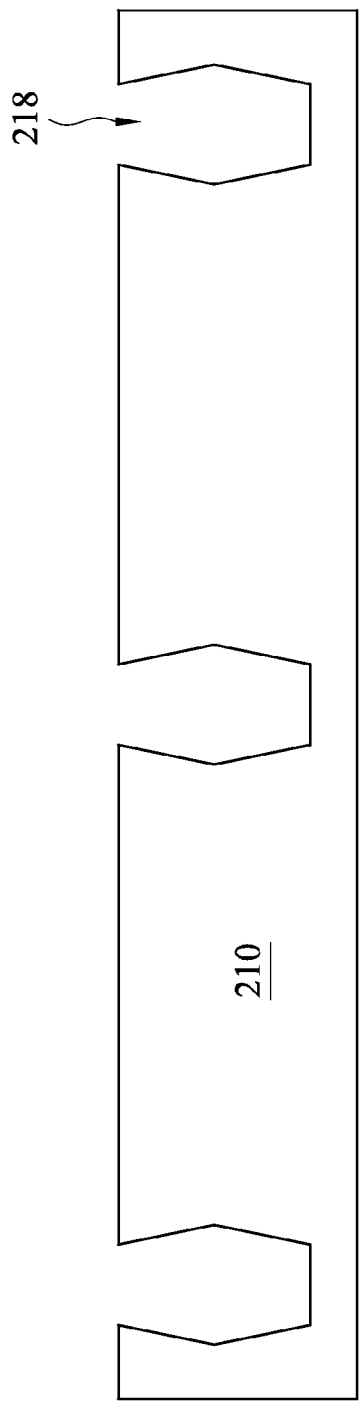
FIG. 2A-FIG. 2H are schematic cross-sectional views of intermediate stages showing a method for forming a semiconductor device according to various embodiments.
Figure 2B:
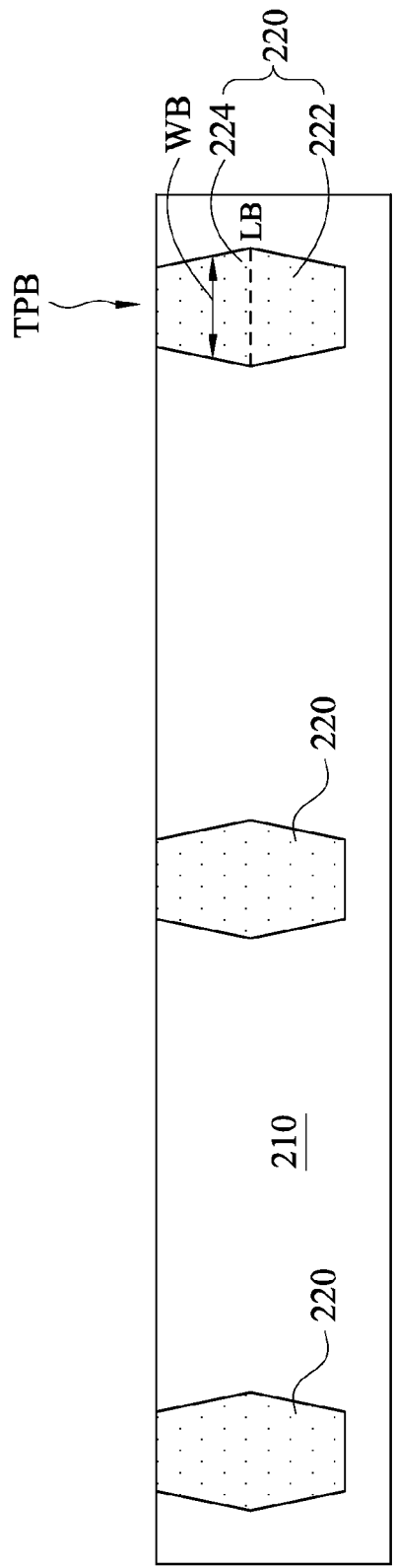

Referring to FIG. 2A-FIG. 2H, FIG. 2A-FIG. 2H are schematic cross-sectional views of intermediate stages showing a method for forming a semiconductor device according to various embodiments. As shown in FIG. 2A, trenches 218 with a diamond-like structure are formed in a semiconductor substrate 210 to define locations of active regions. As shown in FIG. 2B, dielectric material (insulator) fills the trenches 218 to form trench isolations 220. The trench isolation 220 includes a lower portion 222 and an upper portion 224. The upper portion 224 is located on the lower portion 222 and has a width WB gradually decreased from a junction LB between the upper portion 224 and the lower portion 222 toward a top TPB of the trench isolation 220. In some embodiments, a width of the junction LB is widest in the upper portion 224, and the junction LB is lower than or aligned to a bottom of an adjacent active region subsequently formed in the semiconductor substrate 210. In some embodiments, a cross section of the trench isolation is substantially the same as that of a diamond.

Figure 2C:
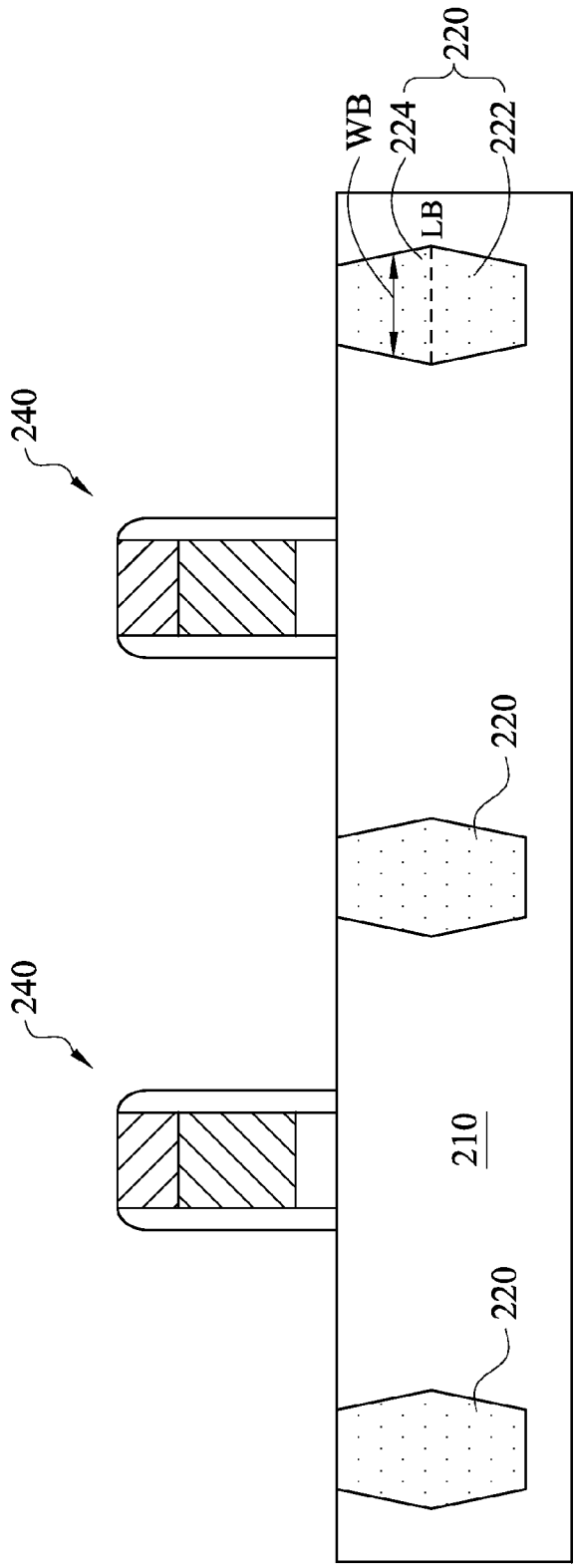
Figure 2D:
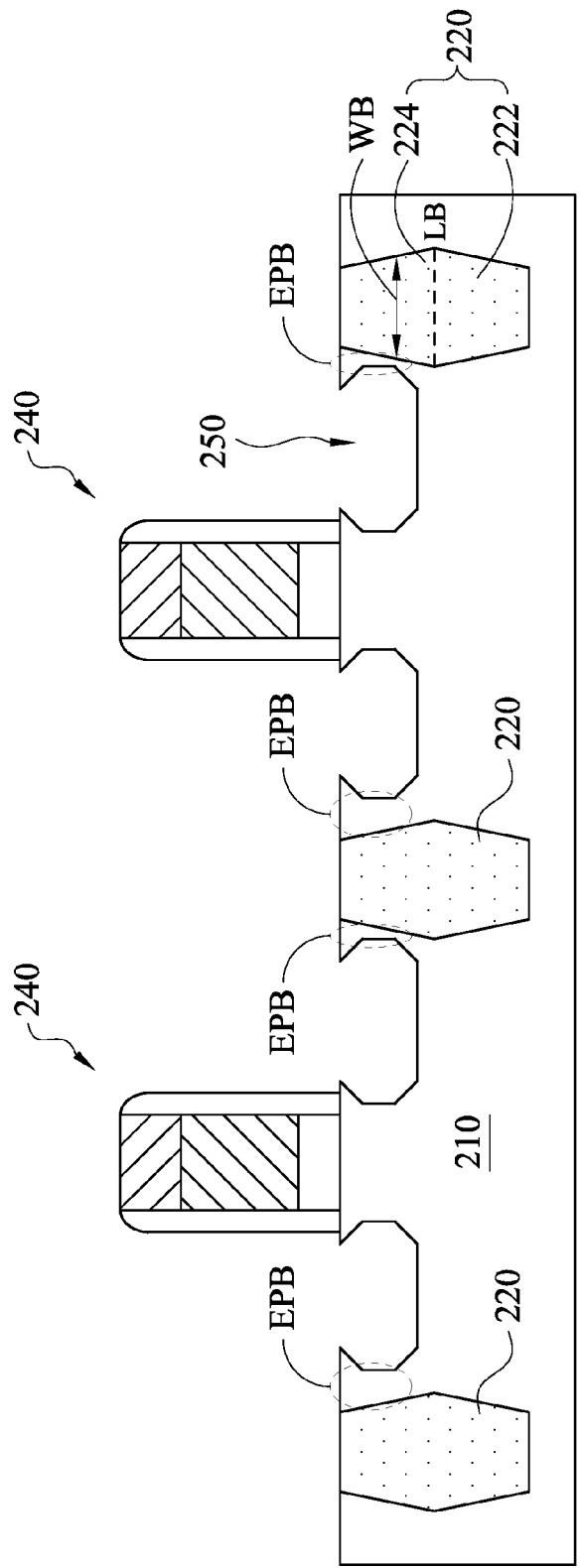

As shown in FIG. 2C, gate structures 240 are formed on the semiconductor substrate 210. Each of the gate structures 240 is located between two adjacent trench isolations 220. In some embodiments, dummy gate structures are optionally formed on the trench isolations 220. As shown in FIG. 2D, source/drain recesses 250 are formed in the semiconductor substrate 210. A substrate portion EPB remains after the formation of the source/drain recesses 250.

Figure 2E:
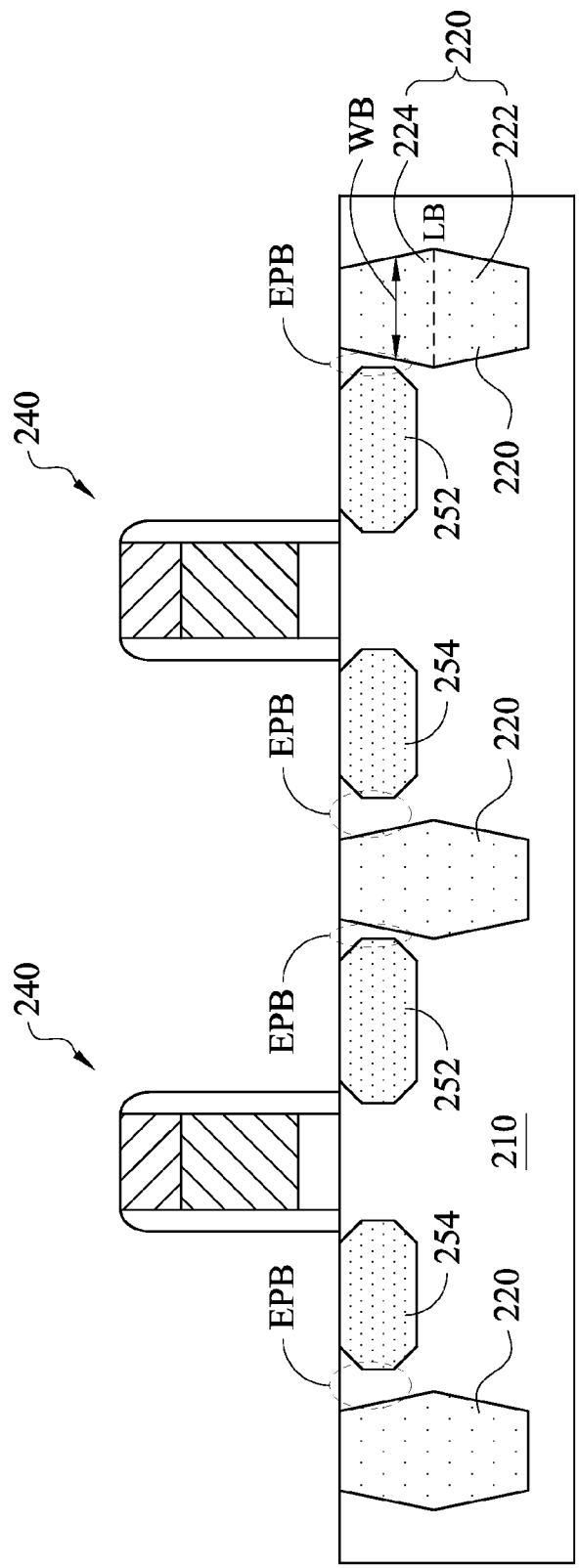

As shown in FIG. 2E, drain regions 252 and source regions 254 are formed in the source/drain recesses 250. The drain region 252 and the source region 254 are formed by using an epitaxial process. When the epitaxial process is performed to form a source/drain region, the substrate portion EPB provides a suitable surface to help the growth of the source/drain region. For example, when an epitaxial process is performed to form the drain region 252, the semiconductor material of the drain region 252 may be deposited on the surface of the substrate portion EPB. The trench isolation 220 does not interfere the growth of the semiconductor materials of the drain region 252 and prevent the drain region 252 from forming a facet.

Figure 2F:
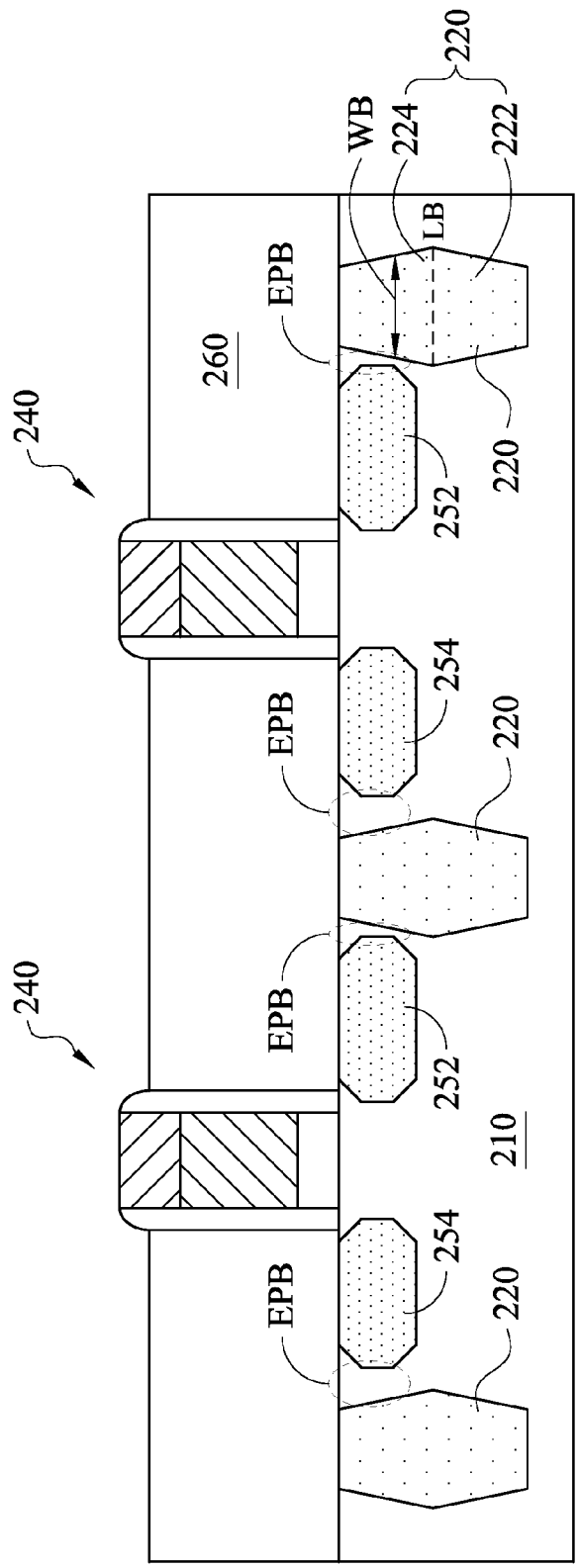
Figure 2G:
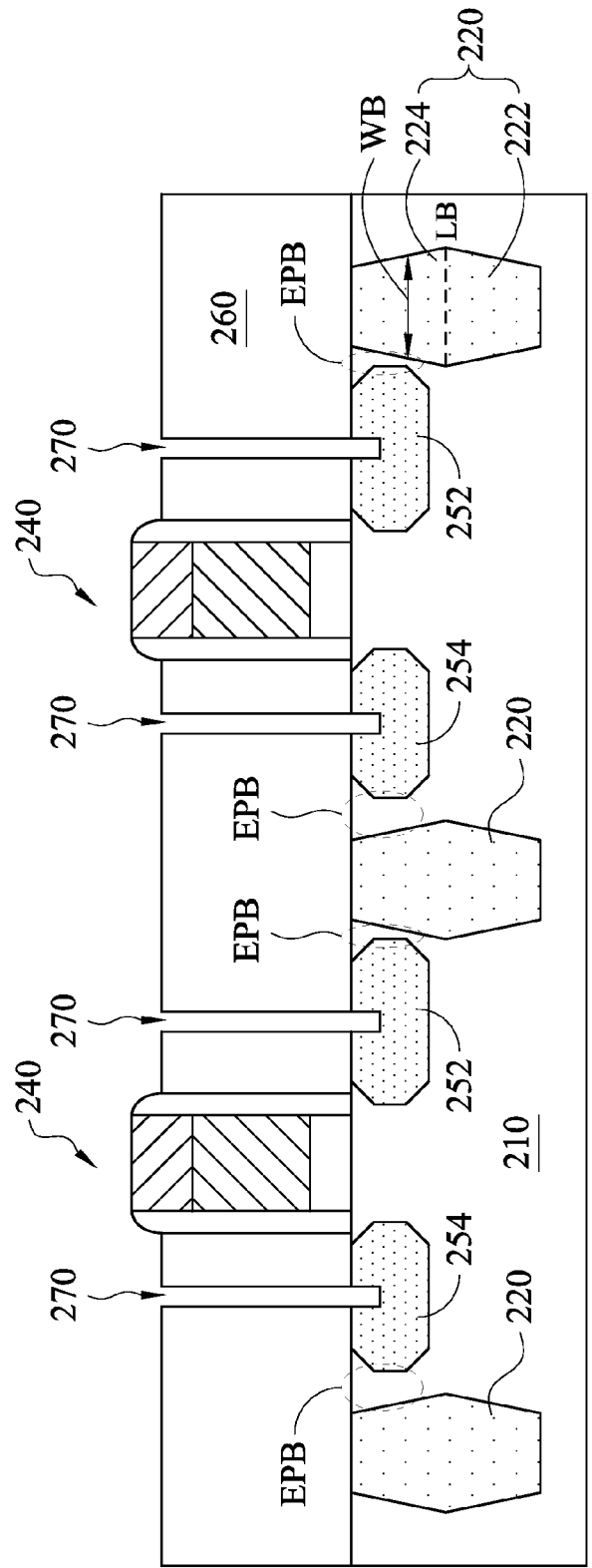
Figure 2H:
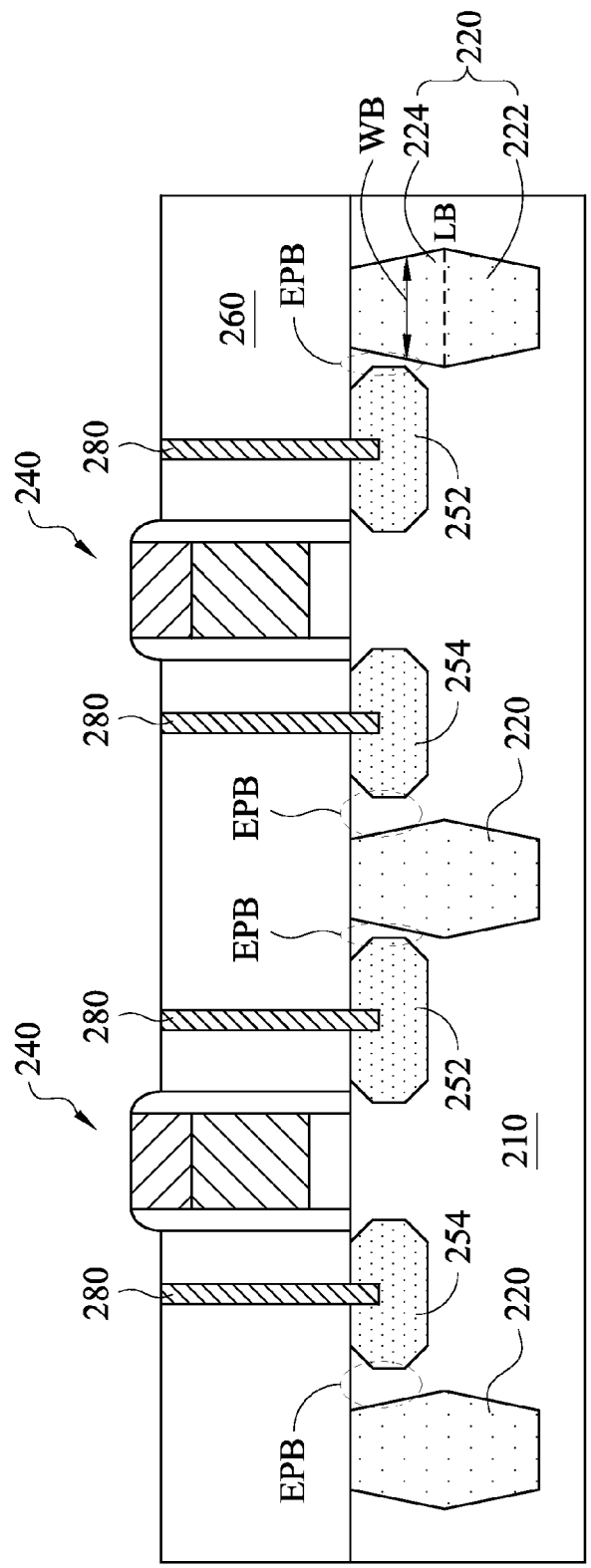

As shown in FIG. 2F, a dielectric layer 260 is formed on the substrate 210. The dielectric layer 260 covers the drain regions 252 and the source regions 254. As shown in FIG. 2G, openings 270 are formed in the dielectric layer 260. The openings 270 extend through the dielectric layer 260 to expose the drain region 252 and the source region 254. As shown in FIG. 2H, contact structures 280 are formed on the drain regions 252 and the source regions 254.

Figure 3:
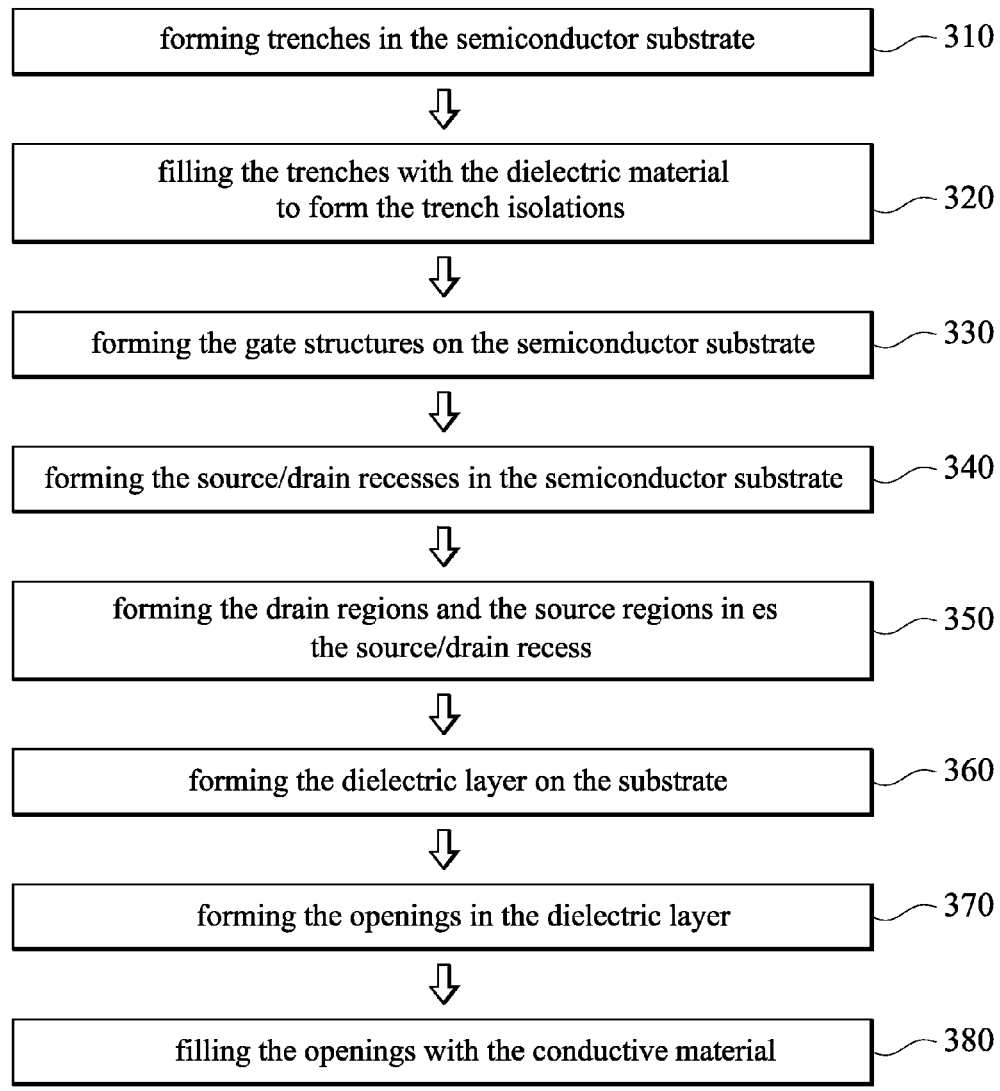
FIG. 3 is a flow chart of a method for fabricating a semiconductor device in accordance with various embodiments.

Referring to FIG. 3 with FIG. 2A-FIG. 2H, FIG. 3 is a flow chart of a method 300 for fabricating a semiconductor device in accordance with various embodiments. The method 300 begins at operation 310, where trenches 218 are formed in the semiconductor substrate 210, as shown in FIG. 2A. The trenches 218 can be formed by using wet etching. At operation 320, the dielectric material 220b fills the trenches 218 to form the trench isolations 220, as shown in FIG. 2B. A chemical vapor deposition (CVD) process or a physical vapor deposition (PVD) can be used to fill the trenches 218. At operation 330, the gate structures 240 are formed on the semiconductor substrate 210, as shown in FIG. 2C.

At operation 340, the source/drain recesses 250 are formed in the semiconductor substrate 210, as shown in FIG. 2D. In some embodiments, the source/drain recesses 250 are formed by first using dry etch to form a recess depth and then using a wet etch to form the desired profile. In some embodiments, the dry etch is performed by using plasma chemistry gas like $HBr/Cl_2/O_2/N_2/NF_3/SF_6/CxFyHz$, and the wet etch is performed by using an etchant such as TMAH (Tetramethylammonium hydroxide). Other suitable dry and/or wet etching processes well known in the art also may be used for forming the source/drain recesses 250.

At operation 350, the drain regions 252 and the source regions 254 are formed in the source/drain recesses 250 by using an epitaxial process, as shown in FIG. 2E. In some embodiments, the epitaxial process includes a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof.

At operation 360, the dielectric layer 260 is formed on the substrate 210, as shown in FIG. 2F. The dielectric layer 260 is formed by using plasma enhanced chemical vapor deposition (PECVD), spin-on deposition, or the like. In some embodiments, the dielectric layer 260 is formed to cover the gate structures 240s, the drain regions 252 and the source regions 254, and a subsequent chemical mechanical polishing (CMP) process is performed on the dielectric layer 260 until the contact or electrode of the gate structures 240 is exposed.

At operation 370, the openings 270 are formed in the dielectric layer 260 by etching the dielectric layer 260 by using a photolithographic process, as shown in FIG. 2G. At operation 380, conductive material fills the openings 270 to form the contact structures 280 by using a chemical vapor deposition process or a physical vapor deposition, as shown in FIG. 2H.

In accordance with some embodiments, the present disclosure discloses a semiconductor device including a semiconductor substrate, an active region, and a trench isolation. The active region is formed in the semiconductor substrate. The trench isolation is disposed adjacent to the active region. The trench isolation includes a lower portion and an upper portion. The upper portion is located on the lower portion. The upper portion has a width gradually decreased from a junction between the upper portion and the lower portion toward a top of the trench isolation.

In accordance with certain embodiments, the present disclosure discloses a method for fabricating a semiconductor device. In this method, at first, a semiconductor substrate is etched to form a trench in the semiconductor substrate. Then, an insulator fills the trench to form a trench isolation, wherein a width of the trench isolation is gradually decreased from a junction between an upper portion and a lower portion to a top of the trench isolation. Thereafter, a gate structure is formed on the semiconductor substrate. Then, the semiconductor substrate is etched to form a recess adjacent to the trench isolation. Thereafter, at least one doped epitaxial layer grows in the recess.

In accordance with certain embodiments, the present disclosure discloses a semiconductor device including a semiconductor substrate, active regions, and trench isolations. The active regions is formed in the semiconductor substrate. Each of the trench isolations is disposed between two of the active regions and includes a lower portion and an upper portion. The upper portion is located on the lower portion and has a width gradually decreased from a junction between the upper portion and the lower portion toward a top of the trench isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a plurality of active regions formed in the semiconductor substrate; and
   a plurality of trench isolations, wherein the trench isolations are separated from each other, and each of the trench isolations is disposed between two of the active regions and comprises:
   a lower portion; and
   an upper portion located on the lower portion and having a width gradually decreased from a junction between the upper portion and the lower portion toward a top of the trench isolation.

2. The semiconductor device of claim 1, wherein the trench isolation comprises silicon oxide.

3. The semiconductor device of claim 1, wherein a width of the junction between the upper portion and the lower portion is widest in the upper portion, and the junction between the upper portion and the lower portion is lower than or aligned to a bottom of the adjacent active region.

4. The semiconductor device of claim 1, wherein a cross section of each of the trench isolations is substantially the same as that of a diamond.

5. The semiconductor device of claim 1, further comprises a dummy gate structure disposed on one of the trench isolations.

6. The semiconductor device of claim 1, wherein each of the active regions comprises a doped epitaxial source region and a doped epitaxial drain region.

7. The semiconductor device of claim 6, further comprising a plurality of gate structures disposed on the active regions in a one to one manner, and each of the gate structures is located between the doped epitaxial source region and the doped epitaxial drain region of a corresponding active region.

8. The semiconductor device of claim 7, further comprises a plurality of contact structures landing on the doped epitaxial source region and the doped epitaxial drain region of each of the active regions.

9. The semiconductor device of claim 7, wherein each of the gate structures comprises:
a gate dielectric;
a gate electrode disposed on the gate dielectric; and
a silicide contact disposed on the gate electrode.

10. The semiconductor device of claim 9, wherein the gate dielectric is a high-K dielectric material.

11. A semiconductor device, comprising:
a semiconductor substrate;
an active region disposed in the semiconductor substrate; and
a first trench isolation and a second trench isolation disposed adjacent to the active region, wherein the first trench isolation and the second trench isolation are separated from each other, and the active region is located between the first trench isolation and the second trench isolation, and each of the first trench isolation and the second trench isolation comprises:
a lower portion; and
an upper portion located on the lower portion and having a width gradually decreased from a junction between the upper portion and the lower portion toward a top of the trench isolation.

12. The semiconductor device of claim 11, wherein each of the first trench isolation and the second trench isolation comprises silicon oxide.

13. The semiconductor device of claim 11, wherein a width of the junction between the upper portion and the lower portion is widest in the upper portion, and the junction between the upper portion and the lower portion is lower than or aligned to a bottom of the adjacent active region.

14. The semiconductor device of claim 11, wherein a cross section of each of the first trench isolation and the second trench isolation is substantially the same as that of a diamond.

15. The semiconductor device of claim 11, wherein the active region comprises a doped epitaxial source region or a doped epitaxial drain region.

16. The semiconductor device of claim 15, further comprising a gate structure disposed between the doped epitaxial source region and the doped epitaxial drain region.

17. The semiconductor device of claim 16, further comprising a plurality of contact structures disposed on the doped epitaxial source region and the doped epitaxial drain region.

18. The semiconductor device of claim 16, wherein the gate structure comprises:
a gate dielectric;
a gate electrode disposed on the gate dielectric; and
a silicide contact disposed on the gate electrode.

19. The semiconductor device of claim 18, wherein the gate dielectric is a high-K dielectric material.

20. The semiconductor device of claim 18, wherein the gate structure further comprises a plurality of spacers disposed along sidewalls of the gate dielectric and the gate electrode.

\* \* \* \* \*